(12) United States Patent
Siddiqui et al.

(10) Patent No.: US 7,022,255 B2
(45) Date of Patent: Apr. 4, 2006

(54) CHEMICAL-MECHANICAL PLANARIZATION COMPOSITION WITH NITROGEN CONTAINING POLYMER AND METHOD FOR USE

(75) Inventors: Junaid Ahmed Siddiqui, Richmond, VA (US); Bin Hu, Chandler, AZ (US)

(73) Assignee: DuPont Air Products Nanomaterials LLC, Tempe, AZ (US)

( * ) Notice: Subject to any disclaimer, the term of this patent is extended or adjusted under 35 U.S.C. 154(b) by 266 days.

(21) Appl. No.: 10/683,258

(22) Filed: Oct. 10, 2003

(65) Prior Publication Data

US 2005/0079718 A1    Apr. 14, 2005

(51) Int. Cl.
*C09K 13/00* (2006.01)
*C09K 13/04* (2006.01)

(52) U.S. Cl. .................. 252/79.1; 252/79.4; 438/692
(58) Field of Classification Search ............... 252/79.1, 252/79.4; 438/692
See application file for complete search history.

(56) References Cited

U.S. PATENT DOCUMENTS

| | | | |
|---|---|---|---|
| 3,620,978 A | 11/1971 | Moore, Jr. | |
| 3,745,126 A | 7/1973 | Moore, Jr. et al. | |
| 4,824,623 A * | 4/1989 | Rambosek | 264/622 |
| 5,876,490 A | 3/1999 | Ronay | |
| 6,428,721 B1 | 8/2002 | Ina et al. | |
| 6,485,355 B1 | 11/2002 | Economikos et al. | |
| 6,503,418 B1 | 1/2003 | Sahota et al. | |
| 6,524,168 B1 | 2/2003 | Luo et al. | |
| 6,746,498 B1 * | 6/2004 | Buehler | 51/308 |
| 2002/0043026 A1 | 4/2002 | Luo et al. | |
| 2002/0096659 A1 | 7/2002 | Sakai et al. | |
| 2002/0123224 A1 | 9/2002 | Lee et al. | |
| 2002/0132563 A1 | 9/2002 | Luo et al. | |

FOREIGN PATENT DOCUMENTS

| | | |
|---|---|---|
| WO | WO 01/12739 A1 | 2/2001 |
| WO | WO 01/12740 A1 | 2/2001 |
| WO | WO 01/12741 A1 | 2/2001 |
| WO | WO 02/34469 A1 | 5/2002 |
| WO | WO 02/051955 A1 | 7/2002 |

OTHER PUBLICATIONS

B.L. Mueller, et al, "Polishing Surfaces for Integrated Circuits," Chemtech, Feb., 1998, pp. 38-46.
H. Landis, et al, "Integration of Chemical-Mechanical Polishing Into CMOS integrated Circuit Manufacturing," Thin Solids Films, 1992, P. 1-7, vol. 220.
Kumar, et al, "Chemical-Mechanical Polishing of Copper in Glycerol Based Slurries," Mat. Res. Soc. Symp. Proc., 1996, vol. 427.
Gutmann, et al, "Chemical-Mechanical Polishing of Copper with Oxide and Polymer Interlevel Dielectrics," Thin Solid Films 270, 1995, P. 596-600.
Luo, et al, "Stabilization of Alumina Slurry for Chemical-Mechanical Polishing of Copper," Langmuir, 1996, P. 3563-3566, vol. 12.
Carpio, et al., "Initial Study on Copper CMP Slurry Chemistries," Thin Solid Films 266, 1995, P. 238-244.
Z. Stavreva, et al., "Influence of Process Parameters on Chem.-Mech. Polishing of Copper," Micro. Engineering, 1997, P. 143-149, vols. 37-38.
D. Zeidler, et al, "The Interaction Between Different Barrier Metals . . . ," Micro. Engineering, 1997, P. 237-243, vols. 37-38.
Z. Stavreva, et al, "Chem.-Mech. Polishing of Copper for . . . ," Micro. Engineering, 1997, P. 249-257, vol. 33.
D. Zeidler, et al, "Characterization of Cu Chem. Mech. Polishing by . . . ," Micro. Engineering, 1997, P. 259-265, vol. 33.

* cited by examiner

*Primary Examiner*—Nadine Norton
*Assistant Examiner*—Lynette T. Umez-Eronini
(74) *Attorney, Agent, or Firm*—Geoffrey L. Chase

(57) ABSTRACT

A composition and associated method for chemical mechanical planarization (or other polishing) are described. The composition comprises an organometallic-modified colloidal abrasive and a nitrogen-containing polymer compound (e.g., a polyalkyleneimine, such as polyamidopolyethyleneimine). The composition possesses both high stability towards gelling and/or solids formation and high selectivity for metal removal in metal CMP. The composition may further comprise an oxidizing agent in which case the composition is particularly useful in conjunction with the associated method for metal CMP applications (e.g., copper CMP).

16 Claims, No Drawings

CHEMICAL-MECHANICAL PLANARIZATION COMPOSITION WITH NITROGEN CONTAINING POLYMER AND METHOD FOR USE

BACKGROUND OF THE INVENTION

This invention relates generally to the chemical-mechanical planarization (CMP) of metal substrates on semiconductor wafers and slurry compositions therefor. In particular, the present invention relates to a CMP slurry composition that is stable for long periods even under acidic conditions and which is characterized to possess high selectivity for removal of metal in relation to barrier layer and dielectric materials during CMP processing of substrates comprised of metal and dielectric material. This invention is especially useful for copper CMP and most especially for copper CMP step 1.

Chemical mechanical planarization (chemical mechanical polishing, CMP) for planarization of semiconductor substrates is now widely known to those skilled in the art and has been described in numerous patents and open literature publications. Some introductory references on CMP are as follows: "Polishing Surfaces for Integrated Circuits", by B. L. Mueller and J. S. Steckenrider, Chemtech, February, 1998, pages 38–46; and H. Landis et al., Thin Solids Films, 220 (1992), page 1.

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

Silicon based semiconductor devices, such as integrated circuits (ICs), typically include a silicon dioxide dielectric layer. Multilevel circuit traces, typically formed from aluminum or an aluminum alloy or copper, are patterned onto the silicon dioxide substrate.

CMP processing is often employed to remove and planarize excess metal at different stages of semiconductor manufacturing. For example, one way to fabricate a multi-level copper interconnect or planar copper circuit traces on a silicon dioxide substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects.

When one-step copper CMP processing is desired, it is usually important that the removal rate of the metal and barrier layer material be significantly higher than the removal rate for dielectric material in order to avoid or minimize dishing of metal features or erosion of the dielectric. Alternatively, a multi-step copper CMP process may be employed involving the initial removal and planarization of the copper overburden, referred to as a step 1 copper CMP process, followed by a barrier layer CMP process. The barrier layer CMP process is frequently referred to as a barrier or step 2 copper CMP process. Previously, it was believed that the removal rate of the copper and the adhesion-promoting layer and/or the diffusion barrier layer must both greatly exceed the removal rate of dielectric so that polishing effectively stops when elevated portions of the dielectric are exposed. The ratio of the removal rate of copper to the removal rate of dielectric base is called the "selectivity" for removal of copper in relation to dielectric during CMP processing of substrates comprised of copper, tantalum and dielectric material. The ratio of the removal rate of copper to the removal rate of tantalum is called the "selectivity" for removal of copper in relation to tantalum during CMP processing. When CMP slurries with high selectivity for removal of copper and tantalum in relation to dielectric are used, the copper layers are easily over-polished creating a depression or "dishing" effect in the copper vias and trenches. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of copper vias or trenches. In CMP, the materials in the dense array maybe removed or eroded at a faster rate than the surrounding field of dielectric. This causes a topography difference between the field of dielectric and the dense copper array.

A typically used CMP slurry has two actions, a chemical component and a mechanical component. An important consideration in slurry selection is "passive etch rate." The passive etch rate is the rate at which copper is dissolved by the chemical component alone and should be significantly lower than the removal rate when both the chemical component and the mechanical component are involved. A large passive etch rate leads to dishing of the copper trenches and copper vias, and thus, preferably, the passive etch rate is less than 10 nanometers per minute.

A number of systems for CMP of copper have been disclosed. A few illustrative examples are listed next. Kumar et al. in an article entitled "Chemical-Mechanical Polishing of Copper in Glycerol Based Slurries" (*Materials Research Society Symposium Proceedings*, 1996) disclose a slurry that contains glycerol and abrasive alumina particles. An article by Gutmann et al. entitled "Chemical-Mechanical Polishing of Copper with Oxide and Polymer Interlevel Dielectrics" (*Thin Solid Films*, 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (*Langmuir*, 1996) discloses alumina-ferric nitrate slurries that contain polymeric surfactants and BTA. Carpio et al. in an article entitled "Initial Study on Copper CMP Slurry Chemistries" (*Thin Solid Films*, 1995) disclose slurries that contain either alumina or silicon particles, nitric acid or ammonium hydroxide, with hydrogen peroxide or potassium permanganate as an oxidizer.

In relation to copper CMP, the current state of this technology involves use of a two-step process to achieve local and global planarization in the production of IC chips. During step 1 of a copper CMP process, the overburden copper is removed. Then step 2 of the copper CMP process follows to remove the barrier layer and achieve both local and global planarization. Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, step 2 copper CMP selective slurries with respect to tantalum to copper removal rates and copper to oxide removal rates are highly desirable. The ratio of the removal rate of tantalum to the removal rate of copper is called the "selectivity" for removal of tantalum in relation to copper during CMP processing of substrates comprised of copper, tantalum and dielectric material.

There are a number of theories as to the mechanism for chemical-mechanical polishing of copper. An article by Zeidler et al. (*Microelectronic Engineering*, 1997) proposes that the chemical component forms a passivation layer on the copper changing the copper to a copper oxide. The copper oxide has different mechanical properties, such as density and hardness, than metallic copper and passivation changes the polishing rate of the abrasive portion. The above article by Gutmann et al. discloses that the mechanical component abrades elevated portions of copper and the chemical component then dissolves the abraded material. The chemical component also passivates recessed copper areas minimizing dissolution of those portions.

These are two general types of layers that can be polished. The first layer is interlayer dielectrics (ILD), such as silicon oxide and silicon nitride. The second layer is metal layers such as tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

While prior art CMP systems are capable of removing a copper overlayer from a silicon dioxide substrate, the systems do not satisfy the rigorous demands of the semiconductor industry. These requirements can be summarized as follows. First, there is a need for high removal rates of copper to satisfy throughput demands. Secondly, there must be excellent topography uniformity across the substrate. Finally, the CMP method must minimize local dishing and erosion effects to satisfy ever increasing lithographic demands.

Aluminum acetate-modified silica sols have been disclosed in U.S. Pat. Nos. 3,620,978 and 3,745,126 to DuPont.

Polyelectrolytes, such as polyethyleneimine (PEI), have been disclosed as additives for various reasons (e.g., pH adjusting agents, inhibitors, stopping compounds, precipitate/stain suppressors, etc.) in a number of patents or patent publications. Representative examples include U.S. Pat. No. 5,876,490; U.S. Pat. No. 6,428,721; U.S. Patent Publication 2002/0096659A1; U.S. Patent Publication 2002/0132563A1; U.S. Patent Publication 2002/0043026A1; WO Patent Publication 01/12741A1; WO Patent Publication 01/12740A1; WO Patent Publication 01/12739A1; U.S. Pat. No. 6,485,355; U.S. Patent Publication 2002/0123224A1; WO Patent Publication 02/051955A1; U.S. Pat. No. 6,503,418; and WO Patent Publication 02/34469A1.

The roles indicated for the polyelectrolyte additives varies considerably amongst the above-referenced disclosures. In U.S. Pat. No. 6,428,721 to Fujimi, the role indicated for PEI is that of a pH-adjusting agent. In U.S. Pat. No. 5,876,490 to IBM, the role indicated for the PEI polyelectrolyte is that of an additive to impart normal stress effects to the patented compositions. In WO patent publications 01/12741A1; 01/12740A1; and WO 01/12739A1 by Cabot, the role of the nitrogen-containing polyelectrolyte (e.g., PEI) is that of a compound that inhibits the polishing of at least one layer of a substrate having multiple layers. In U.S. Pat. No. 6,503,418 to Advanced Micro Devices and WO Patent Publication 02/051955A1 by Advanced Micro Devices, the role of the organic additive (e.g., PEI) is that of suppressing the formation of precipitates and copper staining during step 2 copper CMP processing.

BRIEF SUMMARY OF THE INVENTION

In one embodiment, the invention is a polishing composition comprising:
 a) an organometallic-modified abrasive; and
 b) a nitrogen-containing polymer compound;

wherein the organometallic-modified abrasive is derived by surface modification of an unmodified abrasive with an organometallic compound, the unmodified abrasive possesses a negative zeta potential, and the organometallic-modified abrasive possesses a positive zeta potential in the polishing composition.

The polishing composition is useful in CMP, especially in metal CMP.

In another embodiment, the invention is a method of polishing comprising the steps of:
 A) placing a substrate in contact with a polishing pad;
 B) delivering a polishing composition comprising a) an organometallic-modified abrasive; and b) a nitrogen-containing polymer compound; and
 C) polishing the substrate with the polishing composition;

wherein the organometallic-modified abrasive is derived by surface modification of an unmodified abrasive with an organometallic compound, the unmodified abrasive possesses a negative zeta potential, and the organometallic-modified abrasive possesses a positive zeta potential in the polishing composition.

DETAILED DESCRIPTION OF THE INVENTION

It has been found that CMP polishing compositions comprising an organometallic-modified abrasive and a nitrogen-containing polymer compound (e.g., a polyalkyleneimine) possess high selectivity for metal removal in relation to barrier and dielectric materials during CMP processing and yet which are stable as dispersions (e.g., lack of gels forming, etc.) for long periods (in sharp contrast to prior art compositions).

Stable CMP Slurry

The stable CMP slurry of this invention comprises a) an organometallic-modified abrasive and b) a nitrogen-containing polymer compound (e.g., a polyalkyleneimine). For metal CMP applications, the stable CMP slurry further comprises c) an oxidizing agent. Optionally, other additives may be included.

The organometallic-modified abrasive of this invention can be any abrasive that, in the unmodified form, has a negative zeta potential and which, upon modification, has a positive zeta potential in the polishing composition. Suitable unmodified abrasives include, but are not limited to, silica, titania, zirconia, germania, ceria, and co-formed products thereof, and mixtures thereof. The unmodified abrasives can be fumed products, colloidal products, or mixtures thereof. Silica is a preferred unmodified abrasive for conversion to the organometallic-modified abrasive component of this invention.

The organometallic-modified abrasive of this invention is obtained by treatment of an unmodified abrasive (e.g., silica) with an organometallic compound. Suitable organometallic compounds include, but are not limited to, aluminum acetate, aluminum formate, aluminum propionate, and copper acetate.

Organometallic-modified silica is the preferred abrasive material used in the present invention. The unmodified silica may be, for example, colloidal silica, fumed silica and other silica dispersions, however, the preferred unmodified silica is colloidal silica. Following modification, preferably, the modified silica is present in the slurry in a concentration of about 0.1 weight % to about 20 weight % of the total weight of the slurry. More preferably, the silica is present in a concentration of about 0.3 weight % to about 10 weight % of the total weight of the slurry. Most preferably, the silica is present in a concentration of about 0.5% to 3% of the total weight of the slurry.

The nitrogen-containing polymer compound of this invention includes, but is not limited to, polyalkyleneimine, polyvinylpyridine, polyvinylpyrrolidone, polyacrylamide, mixtures thereof, and copolymers thereof. The polyalkyleneimine can be polyethyleneimine, modified polyethyleneimines including but not limited to polyamidopolyethyleneimine, polypropyleneimine, and higher homologs thereof.

Polyethyleneimines, as well as other polyalkyleneimines, can be branched or non-branched. Non-branched polyethyleneimines have a generalized chemical structure as follows:

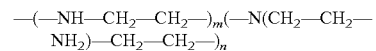

wherein m and n are integers that can be varied independently of each other, and with each having a value greater than or equal to 1.

Branched polyethyleneimines have a generalized chemical structure as follows:

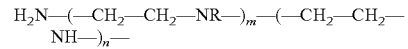

Where R is ($-CH_2-CH_2-N-$) and m and n are greater than or equal to 1, respectively.

Branched polyamidopolyethyleneimine is an acylated branched polyethyleneimine, the primary amine groups are substituted with N-acetyl ($-NHCOCH_3$) groups. The structural formula of polyamidopolyethyleneimine is shown below:

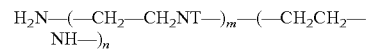

where T is $-CH_2CH_2NHCOCH_3$ (In U.S. Pat. No. 5,453,326, there is given a description of differences between PEI and polyamidopolyethyleneimine via NMR analysis.)

Higher and lower homologs of polyamidopolyethyleneimine can be used in this invention with respect to both the acylated moiety, which can be an acyl group $R'C=O-$, where $R'=$a $C_1-C_8$ alkyl group and the $(CH_2)_p$ (alkylene) moiety where p can range from 1 to 10. As illustrated above, R' for polyamidopolyethyleneimine is $C_1$ and p=2 in the alkylene moiety.

The level of the nitrogen-containing polymer compound in the compositions of this invention ranges from about 0.005 weight % to about 1 weight %, preferably ranges from about 0.01 weight % to about 0.4 weight %, and more preferably ranges from about 0.02 weight % to about 0.2 weight %.

The molecular weight of the nitrogen-containing polymer compound in this invention is not limited but generally ranges, as a number average molecular weight, from about 1,000 to about 1 million. Preferably, the number average molecular weight ranges from about 25,000 Daltons to about 250,000 Daltons and more preferably is about 50,000 Daltons. Oligomers and low molecular weight polymers are included within the broad definition of "polymer compound" given herein.

In embodiments of this invention having an oxidizing agent, the oxidizing agent can be any suitable oxidizing agent. Suitable oxidizing agents include, for example, one or more per-compounds, which comprise at least one peroxy group ($-O-O-$). Suitable per-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Preferred oxidizing agents include, for example, hydrogen peroxide, urea-hydrogen peroxide, sodium peroxide, benzyl peroxide, di-t-butyl peroxide, peracetic acid, monopersulfuric acid, dipersulfuric acid, iodic acid, and salts thereof, and mixtures thereof.

In compositions of this invention directed to metal CMP, (hydrogen peroxide) $H_2O_2$ is used as a preferred oxidizing agent. Preferably the concentration of the $H_2O_2$ is from about 0.2 weight % to about 6 weight % of the total weight of the slurry.

Other chemicals that may be added to the CMP slurry composition include, for example, pH adjusting agents, surfactants, acids, corrosion inhibitors, fluorine-containing compounds, chelating agents, non-polymeric nitrogen-containing compounds, and salts.

Suitable surfactant compounds that may be added to the slurry composition include, for example, any of the numerous nonionic, anionic, cationic or amphoteric surfactants known to those skilled in the art. The surfactant compounds may be present in the slurry composition in a concentration of about 0 weight % to about 1 weight %, preferably about 0.0005 weight % to about 1 weight % and, more preferably in a concentration of about 0.001 weight % to about 0.5 weight % of the total weight of the slurry. The preferred types of surfactants are nonionic, anionic, or mixtures thereof and are most preferably present in a concentration of about 10 ppm to about 1000 ppm of the total weight of the slurry. Nonionic surfactants are most preferred. A preferred nonionic surfactant is Surfynol® 104E, which is a 50:50 mixture by weight of 2,4,7,9-tetramethyl-5-decyn-4,7-diol and ethylene glycol (solvent), (Air Products and Chemicals, Allentown, Pa.).

The pH-adjusting agent is used to improve the stability of the polishing composition, to improve the safety in use or to meet the requirements of various regulations. As a pH-adjusting agent to be used to lower the pH of the polishing composition of the present invention, hydrochloric acid, nitric acid, sulfuric acid, chloroacetic acid, tartaric acid, succinic acid, citric acid, malic acid, malonic acid, various fatty acids, various polycarboxylic acids may be employed. On the other hand, as a pH-adjusting agent to be used for the purpose of raising the pH, potassium hydroxide, sodium hydroxide, ammonia, tetramethylammonium hydroxide, ethylenediamine, piperazine, polyethyleneimine, etc., may be employed. The polishing composition of the present invention is not particularly limited with respect to the pH, but it is usually adjusted to pH 3 to 10.

In metal CMP applications, compositions having acidic or neutral pH values are generally preferred according to this invention. In this case, a suitable slurry pH is from about 3 to about 8, preferably from about 3.5 to about 7, and more preferably, from about 4 to about 6.5.

Other suitable acid compounds that may be added (in place of or in addition to the pH-adjusting acids mentioned supra) to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 5 weight % of the total weight of the slurry.

Suitable corrosion inhibitors that may be added to the slurry composition include, for example, benzotriazole, 6-tolylytriazole, tolyltriazole derivatives, 1-(2,3-dicarboxypropyl)benzotriazole, N-acyl-N-hydrocarbonoxyalkyl aspartic acid compounds, and mixtures thereof. The corrosion inhibitor may be present in the slurry in a concentration of about 0 ppm to about 4000 ppm, preferably from about 10 ppm to about 4000 ppm, and more preferably from about 50 ppm to about 200 ppm of the total weight of the slurry. Two preferred corrosion inhibitors are CDX2128 and CDX2165, both supplied by King Industries, Inc., Norwalk, Conn. which are preferably present in a concentration of about 50 ppm to about 1000 ppm of the total weight of the slurry.

Carboxylic acids, if added, may also impart corrosion inhibition properties to the slurry composition.

To increase the removal rates of the slurry for tantalum and tantalum compounds as well as copper relative to silicon dioxide, fluorine-containing compounds may be added to the slurry composition. Suitable fluorine-containing compounds include, for example, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the slurry composition in a concentration of about 0 weight % to about 5 weight %, and are preferably present in a concentration of about 0.1 weight % to about 2 weight %. A preferred fluorine-containing compound is ammonium fluoride, which is preferably present in a concentration from about 0 weight % to about 1.0 weight % of the total weight of the slurry.

Suitable chelating agents that may be added to the slurry composition include, for example, ethylenediaminetetracetic acid (EDTA), N-hydroxyethylethylenediaminetriacetic acid (NHEDTA), nitrilotriacetic acid (NTA), diethylenetriaminepentacetic acid (DPTA), ethanoldiglycinate, tricine (which is also a pH-adjusting agent) and mixtures thereof. The chelating agents may be present in the slurry composition in a concentration of about 0 weight % to about 3 weight %, preferably from about 0.02 weight % to about 3 weight %, and more preferably from about 0.05 weight % to about 2.0 weight % of the total weight of the slurry. Tricine is a preferred chelating agent/pH-adjusting agent.

Suitable non-polymeric nitrogen-containing compounds that may be added to the slurry composition include, for example, ammonium hydroxide, tetramethylammonium hydroxide, hydroxylamine, monoethanolamine, diethanolamine, triethanolamine, diethyleneglycolamine, N-hydroxylethylpiperazine, and mixtures thereof. These non-polymeric nitrogen-containing compounds may be present in the slurry composition in a concentration of about 0 weight % to about 1 weight %, and, if present, are normally present at a level of about 0.01 weight % to about 0.20 weight % of the total weight of the slurry. A preferred non-polymeric nitrogen-containing compound is ammonium hydroxide and is most preferably present in a concentration of about 0.01 weight % to about 0.1 weight % of the total weight of the slurry.

Suitable salts that optionally may be added to the slurry composition include, for example, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0 weight % to about 10 weight %, and, if present, are normally present at a level of about 0.02 weight % to about 5 weight % of the total weight of the slurry.

Still other chemicals that can be added to the slurry compositions are biological agents such as bactericides, biocides and fungicides especially if the pH is around about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1,2-benzisothiazolin-3-one; 1-hydroxymethyl-5,5-dimethylhydantion; 3-iodo-2-propynyl-butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof.

Associated Methods

The associated methods of this invention entail use of the aforementioned composition (as disclosed supra) for chemical mechanical planarization of substrates comprised of metals and dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

The slurry composition and associated methods of this invention are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk ® | Spin-on | Hybrid organic-inorganic |
| Applied Materials | Black Diamond | CVD | Carbon-doped oxide |
| Dow Chemical | SiLK ™, Porous SiLK ™ | Spin-on | Organic polymer |
| Honeywell Electronic | NANOGLASS ® E | Spin-on | Inorganic oxide-like |
| Materials Novellus Systems | CORAL ® | PECVD | Carbon-doped oxide |

PECVD = Plasma enhanced chemical vapor deposition
CVD = chemical vapor deposition Similarly, the composition and associated methods of this invention are effective for CMP of substrates comprised of various metals, including, but not limited to, tantalum, titanium, tungsten and copper. The composition and associated methods of this invention are particularly useful and preferred for step 1 copper CMP and afford very high selectivities for removal of copper in relation to tantalum and dielectric materials (as illustrated in the examples).

While not being bound by any particular theory, the inventor(s) believes that the following considerations may explain why a polishing composition comprising a) an organometallic-modified abrasive having a positive zeta potential and b) a nitrogen-containing polymer compound is particularly stable towards gel and/or solids formation in an acidic medium. In an acidic medium, the nitrogen-containing polymer compound is protonated and hence is positively charged. With a positive zeta potential, the organometallic-modified abrasive is also positively charged. The two positively charged species will repel one another; hence it is less likely or unlikely that these two components will come in intimate contact and interact in a manner that could lead to gel and/or solids formation. Hence the composition is stabilized towards gel/solids formation relative to prior art compositions.

While again not being bound by theory, the greater efficacy on "selectivity" for removal of copper in relation to tantalum during CMP processing of substrates with polyamidopolyethyleneimine in place of polyethyleneimine in the slurry compositions of this invention is probably due to higher branching in polyamidopolyethyleneimine. Thus, additional branching of either polyethyleneimines or polyamidopolyethyleneimines, is probably effective in producing higher "selectivity" for removal of copper in relation to tantalum. From the standpoint of formulation stability, a polyamidopolyethyleneimine base formulation is equally as stable as a polyethyleneimine base formulation with no settling or floc formation after several weeks of standing at room temperature.

The present invention is further demonstrated by the examples below.

| GLOSSARY | |
|---|---|
| COMPONENTS | |
| Al Ac CS | Aluminum acetate-modified colloidal silica |
| CS | Syton ® HT-50 (DuPont Air Products NanoMaterials L.L.C., Carlsbad, CA) colloidal silica |
| CDX2128 | Corrosion inhibitor - a water soluble amino acid derivative (King Industries, Inc., Norwalk, CT) |
| CDX2165 | Corrosion inhibitor - a tolyltriazole derivative (King Industries, Inc., Norwalk, CT) |

-continued

GLOSSARY

| | |
|---|---|
| S104E | Surfynol® 104E - a 50:50 mixture by weight of 2,4,7,9-tetramethyl-5-decyn-4,7-diol and ethylene glycol (solvent), Air Products and Chemicals, Allentown, PA. |
| Lupasol® SKA | Polyamidopolyethyleneimine (BASF Corporation, 36 Riverside Ave., Rensselaer, New York, 12144) $NH_2-(CH_2CH_2-NT-)_m-(CH_2CH_2NH-)_n$, where T is $-CH_2CH_2NHCOCH_3$ |
| Lupasol® P | Polyethyleneimine (BASF Corporation, 36 Riverside Ave., Rensselaer, New York, 12144 $NH_2-(CH_2CH_2-NR-)_m-(CH_2CH_2NH-)_n$, where R is $-CH_2CH_2NH_2$ |
| PETEOS | Plasma enhanced deposition of tetraethoxy silane, dielectric oxide layer. |
| Politex® Pad | Polishing pad used during CMP, supplied by Rodel, Inc, Phoenix, AZ. |
| TEOS | Tetraethyl orthosilicate |
| Tricine | N-[tris(hydroxymethyl)methyl]glycine, CAS # 5704-04-1 The structure of tricine is as follows: |

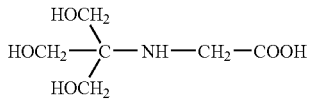

PARAMETERS
General

| | |
|---|---|
| Å: | angstrom(s) - a unit of length |
| BP: | back pressure, in psi units |
| CMP: | chemical mechanical planarization = chemical mechanical polishing |
| CS: | carrier speed |
| DF: | Down force: pressure applied during CMP, units psi |
| min: | minute(s) |
| ml: | milliliter(s) |
| mV: | millivolt(s) |
| psi: | pounds per square inch |
| PS: | platen rotational speed of polishing tool, in rpm (revolution(s) per minute) |
| SF: | slurry flow, ml/min |

Removal Rates and Selectivities

| | |
|---|---|
| Cu RR 4.5 psi | Measured copper removal rate at 4.5 psi down pressure of the CMP tool |
| Cu RR 2 psi | Measured copper removal rate at 2 psi down pressure of the CMP tool |
| Ta RR 2 psi | Measured tantalum removal rate at 2 psi down pressure of the CMP tool |
| PETEOS RR 2 psi | Measured PETEOS removal rate at 2 psi down pressure of the CMP tool |
| Cu:Ta Sel | Copper: Tantalum Selectivity - the ratio of the amount of copper removed to the amount of tantalum removed during CMP experiments under identical conditions. |
| Cu:PETEOS Sel | Copper: PETEOS Selectivity - The ratio of the amount of copper removed to the amount of PETEOS (dielectric material) removed during CMP experiments under identical conditions. |

EXAMPLES

General

All percentages are weight percentages and all temperatures are degrees Centigrade unless otherwise indicated.

CMP Methodology

In the examples presented below, CMP experiments were run using the procedures and experimental conditions given below.

Metrology

PETEOS thickness was measured with a Nanometrics, model, #9200, manufactured by Nanometrics Inc, 1550 Buckeye, Milpitas, Calif. 95035-7418. The metal films were measured with a ResMap CDE, model 168, manufactured by Creative Design Engineering, Inc, 20565 Alves Dr, Cupertino, Calif., 95014. This tool is a four-point probe sheet resistance tool. Twenty-five and forty nine-point polar scans were taken with the respective tools at 3-mm edge exclusion.

CMP Tool

The CMP tool that was used is a Mirra®, manufactured by Applied Materials, 3050 Boweres Avenue, Santa Clara, Calif., 95054. A Rodel Politex® embossed pad, supplied by Rodel, Inc, 3804 East Watkins Street, Phoenix, Ariz., 85034, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by DuPont Air Products NanoMaterials L.L.C., at baseline conditions.

In blanket wafers studies, groupings were made to simulate successive film removal: first copper, next tantalum, and finally the PETEOS. The tool mid-point conditions were: table speed; 123 rpm, head speed; 112 rpm, membrane pressure, 2.0 psi; inter-tube pressure, 0.0 psi; slurry flow, 200 ml/min.

Wafers

Polishing experiments were conducted using electrochemically deposited copper, tantalum, and PETEOS wafers. These blanket wafers were purchased from Silicon Valley Microelectronics, 1150 Campbell Ave, CA, 95126. The film thickness specifications are summarized below:

PETEOS: 15,000 Å on silicon
Copper: 10,000 Å electroplated copper/1,000 Å copper seed/250 Å Ta on silicon
Tantalum: 2000 Å/5,000 Å thermal oxide on silicon Zeta Potential Measurements Zeta potential measurements were made using a Colloidal Dynamics instrument, manufactured by Colloidal Dynamics Corporation, 11-Knight Street, Building E8, Warwick, R.I. 02886. This instrument measures the zeta potential (surface charge) of colloidal particles, such as surface-modified colloidal silica particles.

Surface Coverage Measurements

Surface coverage of aluminum acetate-modified colloidal silica was measured in the following manner. During the preparation of aluminum acetate-modified colloidal silica, aluminum acetate was added to the deionized colloidal silica particles. (The initial colloidal silica used to prepare deionized colloidal silica was Syton® HT-50 (DuPont Air Products NanoMaterials L.L.C., Carlsbad, Calif.), which has a negative zeta potential of −75 to −85 mV.) The addition of aluminum acetate changed the zeta potential of the deionized colloidal silica particle surface from a value near zero (−5 mV to +4 mV, depending upon pH) to +32–36 mV. After reaching the full surface coverage, there was observed to be subsequently no further change in the zeta potential of the surface modified colloidal silica. From the plotted titration curve of measured zeta potential as a function of amount of aluminum acetate added to a given amount of silica during surface modification, the percentage of surface coverage of aluminum acetate on the surface of the surface-modified colloidal silica particles was determined to be approximately 99.9%.

Example 1

Preparation of Aluminum Acetate (Boric Acid Stabilized) Surface-Modified Colloidal Silica The base colloid used in the examples below was aluminum acetate surface-modified colloidal silica. The preparation of this material was done as indicated below.

Aluminum acetate surface-modified colloidal silica was prepared using the following procedure. Deionized water (10,507 grams) and basic aluminum acetate (boric acid stabilized, 1,284 grams, 35.3 weight % alumina equivalent) (Aldrich Chemicals, Milwaukee, Wis.) were combined in a dry mixing vessel (holding approx. 12–15 gallons) that was equipped with high shear agitation means. The mixture was agitated until all solids were completely dissolved affording reaction mixture A.

In a separate clean, dry vessel, deionized water (10,663 grams) and Syton® HT-50 (22,687 grams, approximately 4.31 gallons, DuPont Air Products NanoMaterials L.L.C., Carlsbad, Calif.) were combined with moderate agitation and mixed thoroughly. With moderate agitation at ambient temperature and with continual pH monitoring, spoonfuls of IRC-120 ion exchange resin (approximately 3,907 grams, (Aldrich Chemicals, Milwaukee, Wis.)) were added to this resulting mixture. After each resin batch addition, the reaction mass pH was allowed to stabilize for several minutes. Additional resin batch additions were made until a pH level of 2.00+−0.05 was reached. Soon after attaining the target pH of 2, the reaction mixture was filtered to remove the resin beads and affording reaction mixture B.

With high shear agitation and at ambient temperature, reaction mixture B was added to reaction mixture A at a constant rate over a 1 hour period. Once addition was completed, the high shear agitation was continued for 30 minutes affording the aluminum acetate surface-modified colloidal silica.

The pH of aluminum acetate surface-modified colloidal silica was measured to be 4.6 and zeta potential was measured to be +30 to +40 millivolts. From the measured zeta potential, the surface coverage was estimated to be 99.9% using the methodology presented supra.

Example 2 (Comparative)

For comparative purposes, a slurry was prepared without polyethyleneimine or modified polyethyleneimine having the following composition:

| Component | Amount |
|---|---|
| Al Ac CS* (abrasive) | 5.0 wt. % |
| H$_2$O$_2$ | 1.3 wt. % |
| S104E | 0.05 wt. % |
| CDX2128 | 500 ppm |
| CDX2165 | 500 ppm |
| Water | Balance of composition |

*Aluminum acetate-modified colloidal silica

The slurry was adjusted to pH 4 using acetic acid.
The slurry was used in CMP of a copper substrate and afforded the following results:
Cu RR 2 psi=5792 Å/min
Ta RR2 psi=135 Å/min
PETEOS RR 2 psi=114 Å/min
Cu:Ta Sel=43 at 2 psi
Cu:PETEOS Sel=51 at 2 psi Example 3

A slurry was prepared having the following composition:

| Component | Amount |
|---|---|
| Al AC CS*(abrasive) | 5.0 wt. % |
| H$_2$O$_2$ | 1.3 wt. % |
| S104E | 0.05 wt. % |
| CDX2128 | 500 ppm |

-continued

| Component | Amount |
|---|---|
| CDX2165 | 500 ppm |
| Lupasol ® P** | 0.05 wt. % |
| Water | Balance of composition |

**Number average molecular weight of 60,000 Daltons.
*Aluminum acetate-modified colloidal silica The slurry was adjusted to pH 4 using nitric acid.

A sample of the slurry was stored and monitored over 7 days at 60° C. No observable gel formation or solids formation was observed over this period at ambient temperature.

The slurry was used in CMP of a copper substrate and afforded the following results:
Cu RR 2 psi=4427 Å/min
Ta RR 2 psi=30 Å/min
PETEOS RR 2 psi=31 Å/min
Cu:Ta Sel=148 at 2 psi
Cu:PETEOS Sel=143 at 2 psi

Example 4 (Comparative)

For comparative purposes, a slurry containing unmodified colloidal silica was prepared having the following composition:

| Component | Amount |
|---|---|
| Colloidal silica (unmodified)# | 5.0 wt. % |
| $H_2O_2$ | 1.3 wt. % |
| S104E | 0.05 wt. % |
| CDX2128 | 500 ppm |
| CDX2165 | 500 ppm |
| Lupasol ® P* | 0.05 wt. % |
| Water | Balance of composition |

*Number average molecular weight of 60,000 Daltons.
Syton ® HT-50 (DuPont Air Products NanoMaterials L.L.C., Carlsbad, CA)

The slurry was adjusted to pH 4 using nitric acid.

A sample of the slurry was stored and monitored over 4 hours, during which time the slurry formulation was observed to undergo phase separation. The unmodified colloidal silica, negatively charged, started showing settling within an hour, and after approximately 4 hours flocculated and settled out with gel/solids formation at ambient temperature.

Example 5 (Comparative)

For comparative purposes, a slurry containing unmodified colloidal silica was prepared having the following composition:

| Component | Amount |
|---|---|
| Colloidal silica (unmodified)# | 5.0 wt. % |
| $H_2O_2$ | 1.3 wt. % |
| S104E | 0.05 wt. % |
| Lupasol ® P* | 0.05 wt. % |
| Water | Balance of composition |

*Number average molecular weight of 60,000 Daltons.
Syton ® HT-50 (DuPont Air Products NanoMaterials L.L.C., Carlsbad, CA)

The slurry was adjusted to pH 4 using nitric acid.

As was observed in Example 4, a sample of the slurry was stored and monitored over 4 hours, during which time the slurry formulation was observed to undergo phase separation. The unmodified colloidal silica, negatively charged, started showing settling within an hour, and after approximately 4 hours flocculated and settled out with gel/solids formation at ambient temperature.

Example 6 (Comparative)

For comparative purposes, a slurry containing unmodified colloidal silica was prepared having the following composition:

| Component | Amount |
|---|---|
| Colloidal silica (unmodified)# | 5.0 wt. % |
| $H_2O_2$ | 1.3 wt. % |
| S104E | 0.05 wt. % |
| Lupasol ® SKA* | 0.05 wt. % |
| Water | Balance of composition |

*Number average molecular weight of 250,000 Daltons.
Syton ® HT-50 (DuPont Air Products NanoMaterials L.L.C., Carlsbad, CA)

The slurry was adjusted to pH 4 using nitric acid.

As was observed in Examples 4 and 5, a sample of the slurry was stored and monitored over 4 hours, during which time the slurry formulation was observed to undergo phase separation. The unmodified colloidal silica, negatively charged, started showing settling within an hour, and after approximately 4 hours flocculated and settled out with gel/solids formation at ambient temperature.

Examples 7–11

In Table 1, slurries having different compositions were prepared and tested in CMP to show the effect of polyethyleneimine and polyamidopolyethyleneimine concentration on copper to tantalum selectivity in the absence and presence of corrosion inhibitors. In Examples 7 through 11, the pH was adjusted to 4.0 using either acetic acid or nitric acid; in Example 7, the pH was adjusted with acetic acid whereas in Examples 8, 9, 10, and 11, the pH was adjusted using nitric acid.

TABLE 1[a]

Effect of Polyethyleneimine and Polyamidopolyethyleneimine on Copper to Tantalum Selectivity Using Aluminum Acetate Modified Colloidal Silica.

| | Ex. 7 | Ex. 8 | Ex. 9 | Ex. 10 | Ex. 11 |
|---|---|---|---|---|---|
| Aluminum acetate-modified | 5 | 3 | 3 | 3 | 3 |

TABLE 1ª-continued

Effect of Polyethyleneimine and
Polyamidopolyethyleneimine on Copper to
Tantalum Selectivity Using Aluminum
Acetate Modified Colloidal Silica.

| | Ex. 7 | Ex. 8 | Ex. 9 | Ex. 10 | Ex. 11 |
|---|---|---|---|---|---|
| colloidal silica (wt. %) | | | | | |
| Tricine (wt. %) | | 2 | 2 | 2 | 2 |
| $H_2O_2$ (wt. %) | 3 | 3 | 3 | 3 | 3 |
| S104E (wt. %) | 0.05 | 0.05 | 0.05 | 0.05 | 0.05 |
| CDX2128 (wt. %) | 0 | 0 | 0.025 | 0.025 | 0.025 |
| CDX2165 (wt. %) | 0 | 0 | 0.025 | 0.025 | 0.025 |
| Lupasol ® P (wt. %) | 0.05 | 0.1 | | 0.1 | |
| Lupasol ® SKA (wt. %) | | | | | 0.025 |
| Nitric acid (wt. %) | | 0.03 | 0.22 | 0.028 | 0.04 |
| Acetic acid (wt. %) | 0.4 | | | | |
| Cu RR 4.5 psi (Å/min) | 8506 | 4643 | 5282 | 4679 | 4980 |
| Cu RR 2 psi (Å/min) | 6456 | 1629 | 2988 | 2294 | 2641 |
| Ta RR 2 psi (Å/min) | 35 | 17 | 99 | 10 | 10 |
| PETEOS RR 2 psi (Å/min) | 35 | 24 | 40 | 21 | 45 |
| Cu: Ta Sel at 2 psi | 185 | 96 | 30 | 229 | 264 |
| Cu: PETEOS Sel at 2 psi | 185 | 68 | 75 | 109 | 59 |

ªThe balance of the compositions used in Examples 7–11 is water.

As indicated in Table 1, the highest copper to tantalum selectivity was observed with use of polyamidopolyethyleneimine at a relatively low level (in place of PEI at higher levels).

While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

The invention claimed is:

1. A polishing composition comprising:
   a) an organometallic-modified abrasive; and
   b) a nitrogen-containing polymer compound;
wherein the organometallic-modified abrasive is derived by surface modification of an unmodified abrasive with an organometallic compound, the unmodified abrasive possesses a negative zeta potential, and the organometallic-modified abrasive possesses a positive zeta potential in the polishing composition.

2. The polishing composition of claim 1 wherein the nitrogen-containing polymer compound is a polyalkyleneimine.

3. The polishing composition of claim 1 wherein the abrasive is a colloidal abrasive.

4. The polishing composition of claim 1 further comprising an oxidizing agent.

5. The polishing composition of claim 1 further comprising a corrosion inhibitor that includes a tolyltriazole derivative.

6. The polishing composition of claim 1 further comprising a corrosion inhibitor that includes an amino acid derivative.

7. The polishing composition of claim 1 further comprising a corrosion inhibitor and that includes an amino acid derivative and a tolyltriazole derivative.

8. The polishing composition of claim 1 wherein the organometallic-modified abrasive and the nitrogen-containing polymer compound are characterized to possess the same charge.

9. The polishing composition of claim 1 wherein the abrasive is silica.

10. The polishing composition of claim 1 wherein metal modification is effected with at least one organometallic compound.

11. The polishing composition of claim 10 wherein the at least one organometallic compound comprises aluminum.

12. The polishing composition of claim 2 wherein the polyalkyleneimine is a branched polymer.

13. The polishing composition of claim 2 wherein the polyalkyleneimine is a polyethyleneimine.

14. The polishing composition of claim 13 wherein the polyethyleneimine is substituted and has the structure:

$$H_2N-(-CH_2-CH_2NT-)_m-(-CH_2CH_2-NH-)_n$$

where T is $-(CH_2)_pNHCOR'$, p=1–10, and R' is a $C_1$–$C_8$ alkyl group and where m and n are integers having a value greater than or equal to 1.

15. The polishing composition of claim 1 further comprising a pH of less than 7.

16. The polishing composition of claim 1 further comprising a level of the nitrogen-containing polymer compound in the composition ranges from 0.005 weight % to 1 weight %.

* * * * *